United States Patent
Nishikawa et al.

(10) Patent No.: US 9,041,143 B2
(45) Date of Patent: May 26, 2015

(54) SEMICONDUCTOR DEVICES

(71) Applicant: KABUSHIKI KAISHA TOSHIBA, Tokyo (JP)

(72) Inventors: Yukie Nishikawa, Ishikawa (JP); Nobuhiro Takahashi, Ishikawa (JP); Hironobu Shibata, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/016,965

(22) Filed: Sep. 3, 2013

(65) Prior Publication Data
US 2014/0284755 A1    Sep. 25, 2014

(30) Foreign Application Priority Data
Mar. 22, 2013  (JP) .................. 2013-061114

(51) Int. Cl.
| | | |
|---|---|---|
| *H01L 29/04* | (2006.01) | |
| *H01L 29/417* | (2006.01) | |
| *H01L 29/45* | (2006.01) | |
| *H01L 29/66* | (2006.01) | |
| *H01L 29/861* | (2006.01) | |

(52) U.S. Cl.
CPC ............ *H01L 29/045* (2013.01); *H01L 29/417* (2013.01); *H01L 29/456* (2013.01); *H01L 29/66136* (2013.01); *H01L 29/861* (2013.01)

(58) Field of Classification Search
CPC ...................................................... H01L 29/45
USPC ......... 257/488, 109, 121, 143–144, 140, 152, 257/170
See application file for complete search history.

(56) References Cited

U.S. PATENT DOCUMENTS

| | | | | |
|---|---|---|---|---|
| 5,900,652 A | * | 5/1999 | Battaglia et al. | 257/135 |
| 2002/0195613 A1 | * | 12/2002 | Andoh et al. | 257/121 |
| 2005/0218430 A1 | * | 10/2005 | Kelberlau | 257/211 |
| 2009/0146241 A1 | * | 6/2009 | Yoshii | 257/476 |
| 2010/0148244 A1 | * | 6/2010 | Kitabatake et al. | 257/328 |
| 2012/0299164 A1 | * | 11/2012 | Nishimura et al. | 257/656 |
| 2014/0175612 A1 | * | 6/2014 | Jang | 257/618 |

FOREIGN PATENT DOCUMENTS

| | | |
|---|---|---|
| JP | H11204804 A | 7/1999 |
| JP | H11-274516 A | 10/1999 |
| JP | 2010153619 A | 7/2010 |

* cited by examiner

*Primary Examiner* — Thanh T Nguyen
(74) *Attorney, Agent, or Firm* — Patterson & Sheridan LLP (57) ABSTRACT

The semiconductor device includes a first semiconductor layer of the first conductive type, a second semiconductor layer having the cubic crystalline structure formed on the first semiconductor layer, an electrode formed on the second semiconductor layer, and a reactive region formed between the second semiconductor layer and the electrode. The second semiconductor layer includes an upper surface that is tilted from the (100) plane. The reactive region includes at least one element constituting the second semiconductor layer, at least one element constituting the electrode, and forming a protuberance extending toward the second semiconductor layer.

11 Claims, 8 Drawing Sheets

SEMICONDUCTOR DEVICES

CROSS-REFERENCE TO RELATED APPLICATION

This application is based upon and claims the benefit of priority from Japanese Patent Application No. 2013-061114, filed Mar. 22, 2013, the entire contents of which are incorporated herein by reference.

FIELD

Embodiments described herein relate generally to semiconductor devices.

BACKGROUND

Semiconductor devices used as power devices desirably have a high breakdown voltage characteristics as well as low loss and high speed switching characteristics. For example, a FRD (Fast Recovery Diode) is required to have low forward voltage Vf and low losses. However, in FRD's, there is a design trade-off between breakdown voltage and forward voltage, and therefore, achieving both a high breakdown voltage and low losses is difficult.

DETAILED DESCRIPTION

In general, according to one embodiment, there is provided a semiconductor device having both high breakdown voltage and low loss.

The semiconductor device, according to one embodiment, includes a first semiconductor layer of a first conductive type, a second semiconductor layer having a cubic crystalline structure formed on the first semiconductor layer, an electrode formed on the second semiconductor layer, and a reactive region formed between the second semiconductor layer and the electrode. The second semiconductor layer has an upper surface that is tilted, i.e., having a non-zero angle from the (100) plane. The reactive region includes at least one element of the elements constituting the second semiconductor layer and at least one element of the elements constituting the electrode, and has a protuberance extending toward the second semiconductor layer.

DESCRIPTION OF THE EMBODIMENTS

The configurations of the embodiments are explained, using the attached drawings. Furthermore, identical features or structures within the drawings are assigned identical numbers and the detailed explanation for such features or structures will be omitted where appropriate and only different features of the later drawings will be explained. In addition, in the following embodiments, the first conductive type is an n-type, and the second conductive type is a p-type. Embodiments are not limited to this configuration, and when the first conductive type is the p-type, the second conductive type may be the n-type.

Figure 1A:
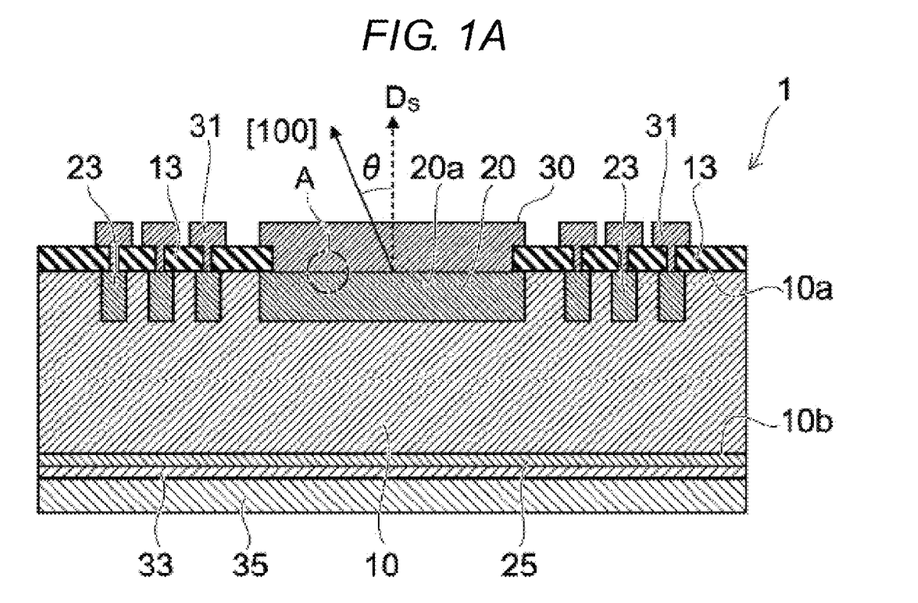
FIGS. 1A and 1B are cross sectional diagrams showing the semiconductor device relating to the embodiments.
Figure 1B:
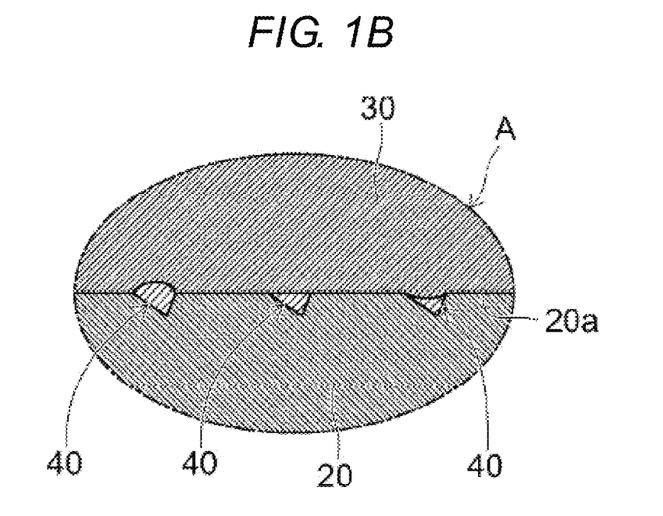

FIGS. 1A and 1B show cross sectional diagrams of the semiconductor device relating to the embodiments. FIG. 1B is an enlarged image of the section circled with the circle-A in FIG. 1A. The semiconductor device 1, for example, is a FRD made of silicon (Si).

The semiconductor device 1 includes an n-type first semiconductor layer (hereinafter referred to as the semiconductor layer 10), a p-type second semiconductor layer (hereinafter referred to as the semiconductor layer 20), and an electrode (hereinafter referred to as the anode electrode 30).

The semiconductor layer 10, for example, is a silicon layer. The semiconductor layer 10 may be an epitaxial (silicon) layer formed on the silicon substrate or may be the silicon substrate itself.

The semiconductor layer 20 has a cubic crystalline structure and is formed on the semiconductor layer 10. In addition, the semiconductor layer 20 includes an upper surface 20a that is tilted a certain angle from the (100) plane. Therefore, as shown in FIG. 1, an inclination angle θ exists between the orientation $D_s$ of the plane of the upper surface 20a and the [100] direction.

The semiconductor layer 20, for example, is formed on the upper surface 10a of the semiconductor layer 10 by selectively doping p-type impurities therein. Also, the upper surface 10a of the semiconductor layer 10 is tilted from the (100) plane.

The anode electrode 30 is formed on the upper surface 20a of the semiconductor layer 20 and contains, for example, aluminum (Al). Furthermore, as shown in FIG. 1B, a reactive region 40 exists between the semiconductor layer 20 and the electrode 30. The reactive region 40 includes at least one of the elements constituting the semiconductor layer 20 and at least one of the elements constituting the electrode 30, and includes a protuberance extending inwardly of the semiconductor layer 20. The boundary surface between the reactive region 40 and the electrode 30 can take various forms, such as a flat surface, a convex form or a concave form with respect to the electrode 30. In addition, the element composition may change gradually between the reactive region 40 and the electrode 30, and a clear boundary surface may not form.

The anode electrode 30, for example, is an Al layer, and the semiconductor layer 20 is a silicon layer. The reactive region 40 lies between the anode electrode 30 and the semiconductor layer 20. The reactive region 40 includes a protuberance including at least Al and Si, a so-called Al spike. Therefore, the contact resistance between the anode electrode 30 and the semiconductor layer 20 can be reduced, and the forward voltage Vf can be kept low.

Additionally, the semiconductor device 1 includes a guard ring 23 that is formed on or into the semiconductor layer 10. The guard ring 23 is formed at a location spaced from the semiconductor layer 20 so as to surround the semiconductor layer 20. Over the semiconductor layer 10 and the guard ring 23, for example, a silicon oxide film 13 is formed. On the silicon oxide film 13 and guard ring 23, the field plate 31 is formed. The guard ring 23 and the field plate 31 are electrically connected. The field plate 31 is not limited to this configuration and, for example, may be formed over the silicon oxide film 13 so as to cover the guard ring and not to be electrically connected to the guard ring.

On the other hand, on the opposite surface 10b of the semiconductor layer 10, for example, an $n^+$ layer 25 having n-type impurities at a higher density than the semiconductor layer 10, is formed. Furthermore, a cathode electrode 35 is formed on a barrier metal layer 33 that is in contact with the $n^+$ layer 25.

Next, the manufacturing steps of the semiconductor device 1 are explained, referring to FIGS. 2A-3C. FIGS. 2A-3C show cross sectional diagrams of the manufacturing steps of the semiconductor device 1.

Figure 2A:
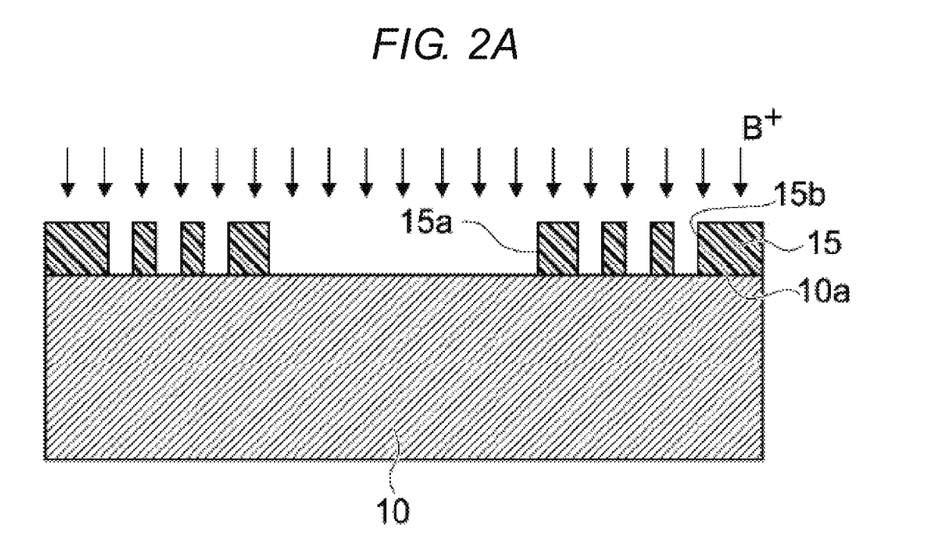
FIGS. 2A and 2B are cross sectional diagrams showing the manufacturing steps of the semiconductor device relating to the embodiments.

As shown in FIG. 2A, boron (B), which is a p-type impurity, is selectively ion-implanted on the upper surface 10a of the semiconductor layer 10. On the upper surface 10a of the semiconductor layer 10, for example, an implantation mask 15 using photoresist is formed.

The semiconductor layer 10, for example, is an n-type silicon substrate, and the plane of the upper surface 10a, is tilted with a certain angle from the (100) plane toward the direction thereof. The inclination angle θ (see FIG. 1), for example, is 20 degrees. The direction of [110] mentioned here includes equivalent directions, such as [0-11], [01-1], and [0-1-1]. Furthermore, the (100) plane may be other equivalent planes, such as (010) and (001).

The implantation mask 15 includes the openings 15a and 15b. The opening 15a corresponds to the area constituting the semiconductor layer 20, and the opening 15b corresponds to the area constituting the guard ring 23. The amount of ion implantation of the boron, for example, is $5 \times 10^{12}$ cm$^{-2}$.

Figure 2B:
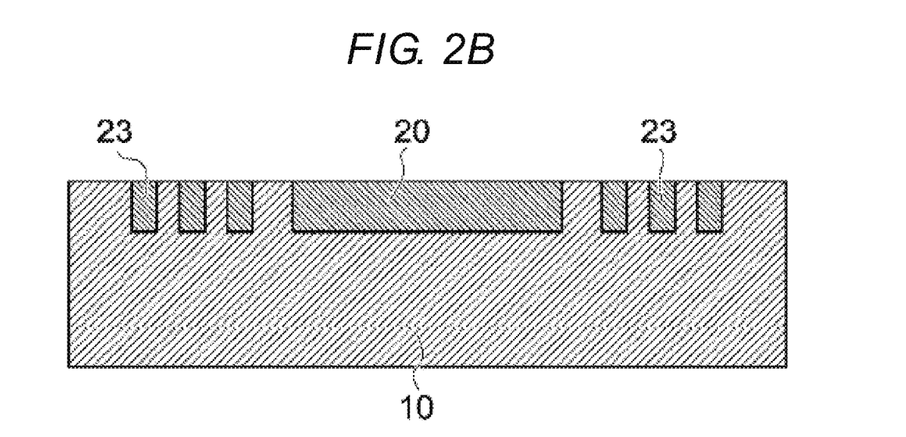

Next, as shown in FIG. 2B, the p-type semiconductor layer and the guard ring 23 are formed by treating the semiconductor layer 10 with heating treatment i.e., by annealing the boron implanted substrate. By heating treatment the semiconductor layer 10, the ion implanted boron is activated and diffused in the semiconductor layer 10. The thickness of the semiconductor layer 20, for example, is 4 μm. In other words, the semiconductor layer 20 is formed to so as to extend 4 μm into the upper surface 20a.

Figure 3A:
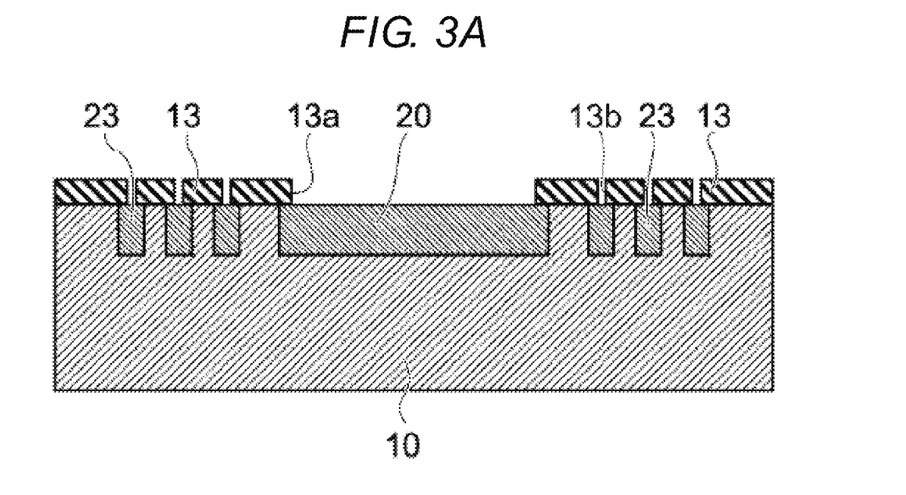
FIGS. 3A to 3C are cross sectional diagrams showing the manufacturing steps, continuing from FIG. 2.

Next, as shown in FIG. 3A, a silicon oxide film 13 is formed over the semiconductor layer 10, the semiconductor layer 20, and the guard ring 23, and the opening 13a on the semiconductor layer 20 and the opening 13b on the guard ring 23 are formed by etching the silicon oxide film 13 to yield the structure shown in FIG. 3A.

Figure 3B:
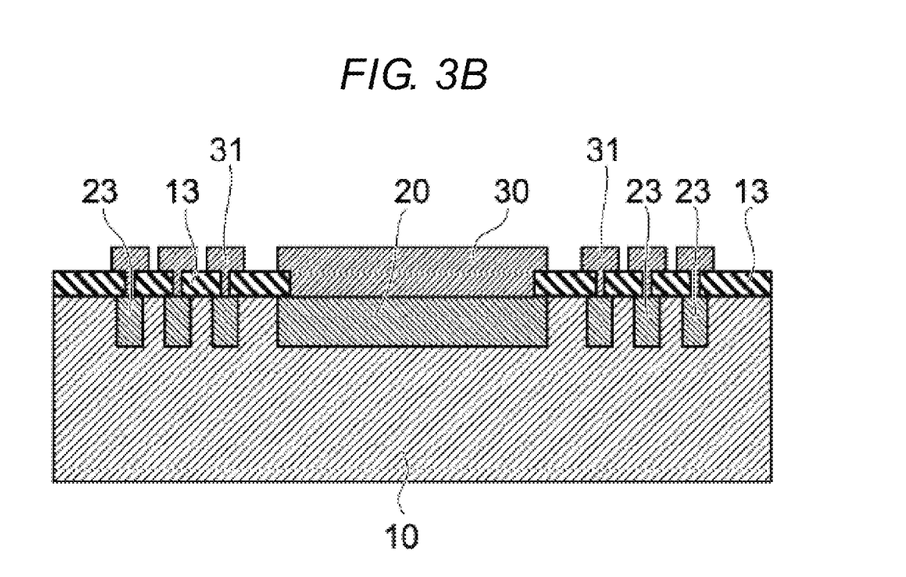

Then, as shown in FIG. 3B, the film to form the anode electrode 30 is formed in the opening 13a to contact the semiconductor layer 20 through the opening 13a, and the field plate 31 that is in contact with the guard ring 23 through the opening 13b is deposited, and then etched to form the structure of FIG. 3B. The field plate 31 is formed independently on each guard ring 23 and it also extends over the surface of the silicon oxide film 13. The anode electrode 30 and the field plate 31, for example, are formed by patterning the metal films containing Al on the silicon oxide film 13 and the semiconductor layer 20.

Al, AlSi, AlCu, or AlSiCu, etc. are used for the metal films. For example, in case of AlSi, Si concentration between a few ppm to 1% in Al may be used. Although by adding a little amount of Si to Al, the temperature at which the Al spike formed tends to increase, the effect of using the semiconductor layer 20 with the upper surface 20a tilted from the (100) plane is the same as when Al that does not contain Si is used.

Thereafter, the semiconductor layer 10 and the anode electrode 30 are annealed. The annealing, for example, is done at 420° C. for 30 minutes. This causes the semiconductor layer 20 and the anode electrode 30 to inter-react, and Si in the semiconductor layer 20 and Al in the anode electrode 30 alloy to form the reactive region 40. The annealing temperature can be varied between 380° C. and 500° C. If it is lower than 380° C., the reactive region is not formed. The other hand, if it is higher than 500° C., the reactive region is formed too deep to reach the semiconductor layer 10. So it is important to set the annealing temperature between 380° C. and 500° C. The reactive region 40 may be formed over the entire contact surface on which the anode electrode 30 is in contact with the semiconductor layer 20. In addition, the reactive region 40 includes at least the Al spike protruding from the anode electrode 30 into the semiconductor layer 20. This configuration reduces the contact resistance between the semiconductor layer 20 and the anode electrode 30.

Figure 3C:
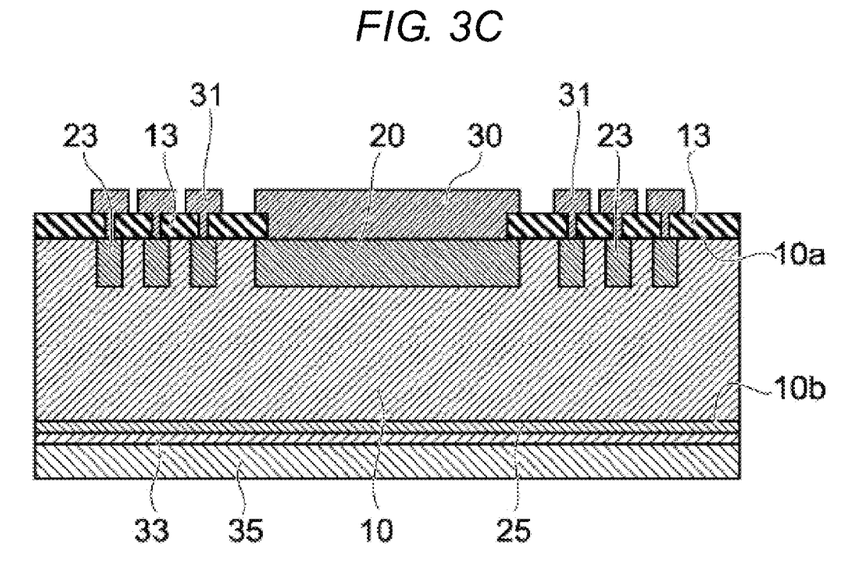

Next, as shown in FIG. 3C, the $n^+$ layer 25 that includes a higher density of n-type impurities than the semiconductor layer 10 is formed on the opposite surface 10b of the semiconductor layer 10. The $n^+$ layer 25, for example, is formed by ion implantation of arsenic (As) or phosphorus (P), which is an n-type impurity, into the lower surface 10b of the semiconductor layer 10, followed by activation and diffusion by heating treatment.

Next, the barrier metal layer 33 that is in contact with the n+ layer 25 is formed. Thereafter the cathode electrode 35 that is in contact with the barrier metal layer 33 is formed, and the semiconductor device 1 is complete. If the barrier metal layer 33 is not necessary, the cathode electrode 35 may be formed directly on the $n^+$ layer 25.

Figure 4A:
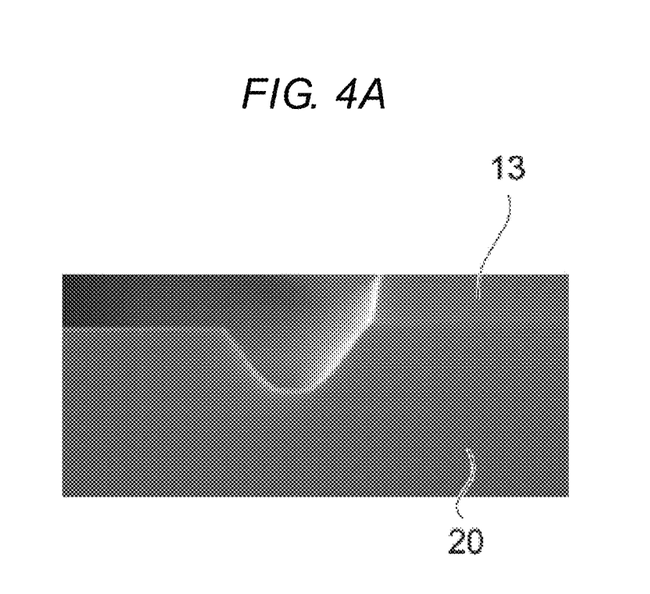
FIGS. 4A to 4D are a SEM (Scanning Electron Microscope) image and diagrams showing the configuration of the reactive region of another semiconductor device relating to the embodiments.
Figure 4B:
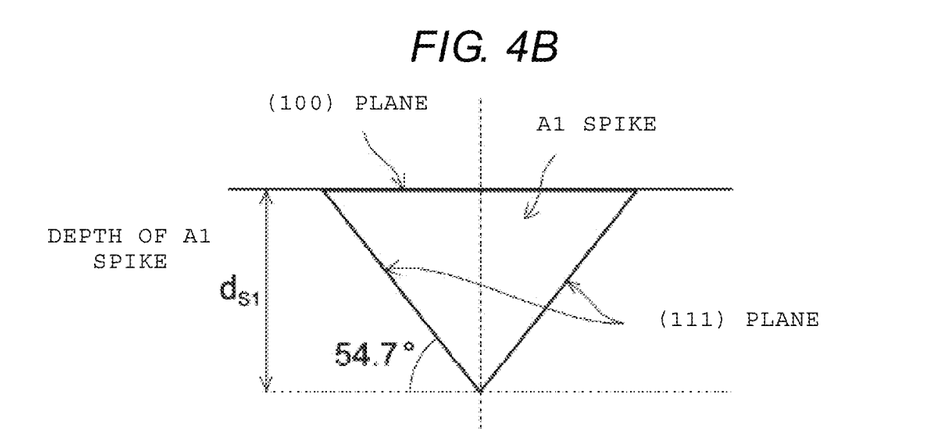
Figure 4C:
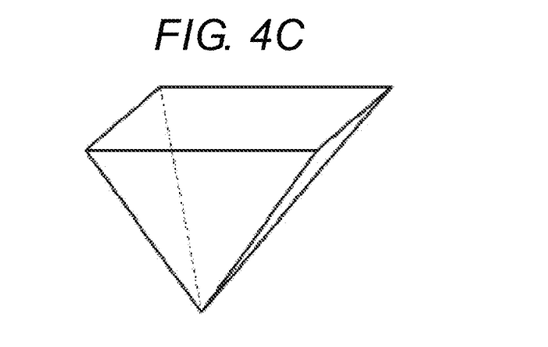
Figure 4D:
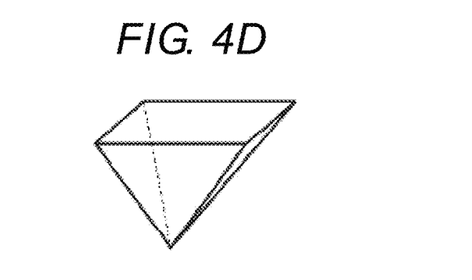
Figure 5A:
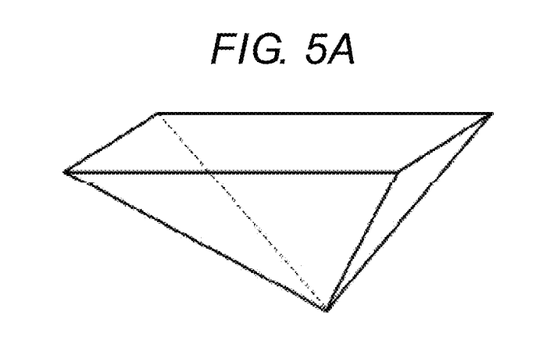
FIGS. 5A and 5B are diagrams showing the configuration of the reactive region of another semiconductor device relating to the embodiments.
Figure 5B:
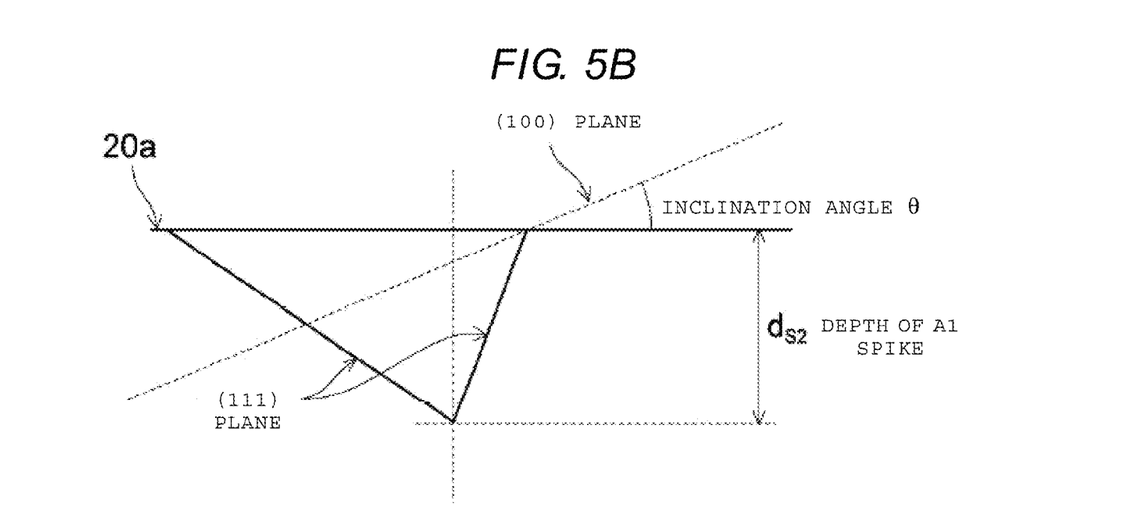

The FIGS. 4 and 5 show SEM images and diagrams of the shape of the Al spike that is at least part of the reactive region 40 of the semiconductor device 1 relating to the embodiments, which protrudes into the semiconductor layer 20. To obtain the SEM of FIG. 4a, for example, the anode electrode 30 is etched using Al selective etchant, such that holes corresponding to the shape of the Al spikes of the semiconductor layer 20 of the reactive region 40 remain in the upper surface 20a of the semiconductor layer 20. The FIGS. 4A-5B each shows the shape of the holes that remain in the upper surface 20a of the semiconductor layer 20, therefore, the shape of the Al spike that is the protuberance into the semiconductor layer 20.

FIG. 4A shows a cross sectional SEM image of the configuration of the Al spike when the inclination angle θ toward the (100) plane is set to 0° (zero degree). FIG. 4B show the cross section diagram of the Al spike when the inclination angle θ is set to 0°. The FIGS. 4C and 4D are the perspective drawings of the Al spike when the inclination angle θ is set to 0°.

By the heating treatment, such as annealing after the formation of the anode electrode 30, the semiconductor layer 20 and the anode electrode inter-react, Si of the semiconductor layer 20 is transferred to Al of the anode electrode 30. This way, the Al spike as shown in the FIGS. 4A-4D is formed in the semiconductor layer 20.

As shown in FIG. 4A, the width of the Al spike is formed so as to be narrowing with the depth. As shown in FIG. 4B, the four sides of the Al spike are parallel to the (111) plane of the semiconductor layer 20. In other words, the sides of the Al spike are formed along the (111) plane of the semiconductor layer 20. As shown in FIGS. 4C and 4D, when the boundary surface between the reactive region 40 and the electrode 30 is flat, the Al spike is configured in the shape of an four-sided pyramid whose base is the (100) plane and the four lateral sides are the (111) planes.

FIG. 4A shows the cross sectional view of the Al spike configured near the boundary of the anode electrode 30 and the silicon oxide film 13. For example, near the boundary of the anode electrode 30 and the silicon oxide film 13, as the reaction between Al and Si progresses, the Al spike is likely to occur. However, occurrence of the Al spike is not limited to the nearby area of the boundary of the anode electrode 30 and the silicon oxide film 13 and may be configured throughout the entire surface on which the anode electrode 30 and the semiconductor layer 20 are touching.

Once the Al spike is formed between the anode electrode 30 and the semiconductor layer 20, the contact surface between the spike and semiconductor layer forms along the lateral sides of the square pyramid. Furthermore, the contact resistance between AlSi and Si is lower than that between Al and Si. This way, the contact resistance between the anode electrode 30 and the semiconductor layer 20 is reduced, resulting in the Vf reduction of the semiconductor device 1.

On the other hand, if the depth of the Al spike $d_{s1}$ is deep relative to the thickness of the semiconductor layer 20, the breakdown voltage of the semiconductor device 1 will be reduced, i.e., be lower or deteriorated. For example, when the amount of the B ion implantation at the semiconductor layer 20 is $5 \times 10^{12}$ cm$^{-2}$, and the thickness of the semiconductor layer 20 is 4 μm, the breakdown voltage is known to deteriorate once the depth of the Al spike $d_{s1}$ exceeds 1 μm.

The increase of the depth of the Al spike ($d_{s1}$) may induce the deterioration of the breakdown voltage characteristics of the semiconductor device 1, and $d_{s1}$ depends on the carrier density of the semiconductor layer 20 (the amount of the B ion implantation) and the thickness of the semiconductor layer 20 (the depth of the B diffusion). In other words, when the amount of the B ion implantation is low, and the depth of the B diffusion is shallow, the breakdown voltage may deteriorate even if the depth of the Al spike $d_{s1}$ is shallow.

For example, a barrier metal layer (TiW layer, etc.) may be arranged between the semiconductor layer 20 and the anode electrode 30 to prevent the Al spike formation. This way, the deterioration of the breakdown voltage characteristics of the semiconductor device 1 can be controlled. However, if a barrier metal layer is inserted between the semiconductor layer 20 and the anode electrode 30, the forward voltage Vf will increase, and a low loss cannot be achieved.

Additionally, as shown in FIG. 4D, the depth of the Al spike $d_{s1}$ can be formed to be shallow as compared to the spike in FIG. 4C. That is to say, the depth of the Al spike $d_{s1}$ can be controlled by the annealing temperature and the annealing time. The higher the annealing temperature and the longer the annealing time, the depth of the Al spike $d_{s1}$ becomes deeper. For example, when the anode electrode 30 is annealed at 420° C. for 10 minutes, the Al spike is approximately 0.4 μm in depth. By controlling the annealing temperature and the annealing time, the deterioration of the breakdown voltage characteristics of the semiconductor device 1 can be controlled. However, the forward voltage Vf of the semiconductor device 1 will increase in comparison to devices 1 having deeper Al spikes. Namely, by the depth of the Al spike becoming shallower from 1 μm to 0.4 μm, the total area of the lateral sides of the Al spike (surface area) decreases by 60%. The contact area between the semiconductor layer 20 and the Al spikes becomes smaller, and the forward voltage Vf increases.

On the other hand, the surface area of the Al spike that controls the contact resistance of the semiconductor layer 20 and the anode electrode 30 also depends on the number of Al spikes configured on the contact surface. That is to say, even if the depth of the Al spike $d_{s1}$ is shallow, if there are many Al spikes, then the total surface area of the spikes becomes large, and the contact resistance of the device can be decreased. However, when two devices involving the different annealing temperatures of 420° and 300° are compared, there is no difference in the number of the Al spikes. Therefore, it is revealed that the contact resistance of the semiconductor layer 20 and the anode electrode 30 depends on the depth of the Al spike(s) $d_{s1}$.

As stated above, when the inclination angle θ of the upper surface 20a of the semiconductor layer 20 from the (100) plane is set to be 0°, and the Al spike is configured to be shallow to avoid the deterioration of the breakdown voltage characteristics, the surface area decreases, and Vf increases. Conversely, when the Al spike is formed to be deep, Vf decreases, but the breakdown voltage characteristics deteriorate. Thus, to achieve both of the high breakdown voltage and low loss (low Vf) is difficult.

FIG. 5 shows an embodiment which decreases the forward voltage Vf while preventing the deterioration of the breakdown voltage characteristics by tilting the upper surface 20a of the semiconductor layer 20 from the (100) plane. FIG. 5A is the perspective drawing showing the configuration of the Al spike when the inclination angle θ between the upper surface 20a and the (100) plane is set to be 20°. FIG. 5B is the cross sectional drawing of the configuration.

As shown in FIG. 5A, on the upper surface 20a that is tilted from the (100) plane, the Al spike, when the boundary surface between the reactive region and electrode 30 is a flat surface, is in the shape of an offset rectangular pyramid. Furthermore, as shown in FIG. 5B, the base of the rectangular pyramid is on the surface 20a of the semiconductor layer 20, and the lateral sides are parallel to (touching) the (111) plane of the semiconductor layer 20.

For example, if the anode electrode 30 is annealed at 420° C. for 30 minutes, the depth of the Al spike $d_{s2}$ is 0.7 μm. Namely, by tilting the upper surface 20a from the (100) plane, the depth of the Al spike $d_{s2}$ can make shallow. On the other hand, the surface area of the tilted Al spike, in a rectangular pyramid shape, is larger than that of a non-tilted Al spike pyramid with the same depth. By tilting the upper surface 20a of the semiconductor layer 20 from the (100) plane, even if the depth of the Al spike $d_{s2}$ is shallow, a larger surface area between the Al spike and the adjacent semiconductor layer 20 can be obtained as compared to an equal sided pyramid Al spike.

Additionally, the surface area of the Al spike depends on the inclination direction of the upper surface 20a. For example, tilting from the (100) plane toward the (111) plane that is parallel to the lateral sides of the Al spike, namely in the direction of [011], a relatively large surface area can be obtained while keeping the depth of the Al spike shallow. Regarding the direction of [011], when the surface is tilted toward the [001] direction which is rotated by 45° from the [011] direction, the surface are of the Al spike is smaller than when tilted toward the [011] direction. It is the same for other directions equivalent to [001], such as [010], [00-1], and [0-10].

In summary, the upper surface 20a of the semiconductor layer 20 is desirable to be tilted from the (100) plane toward the [011] direction. Furthermore, the inclination direction is desirable to be within ±15° from the [011] direction. This way, the semiconductor device 1 can maintain both the high breakdown voltage and low loss characteristics.

Figure 6:
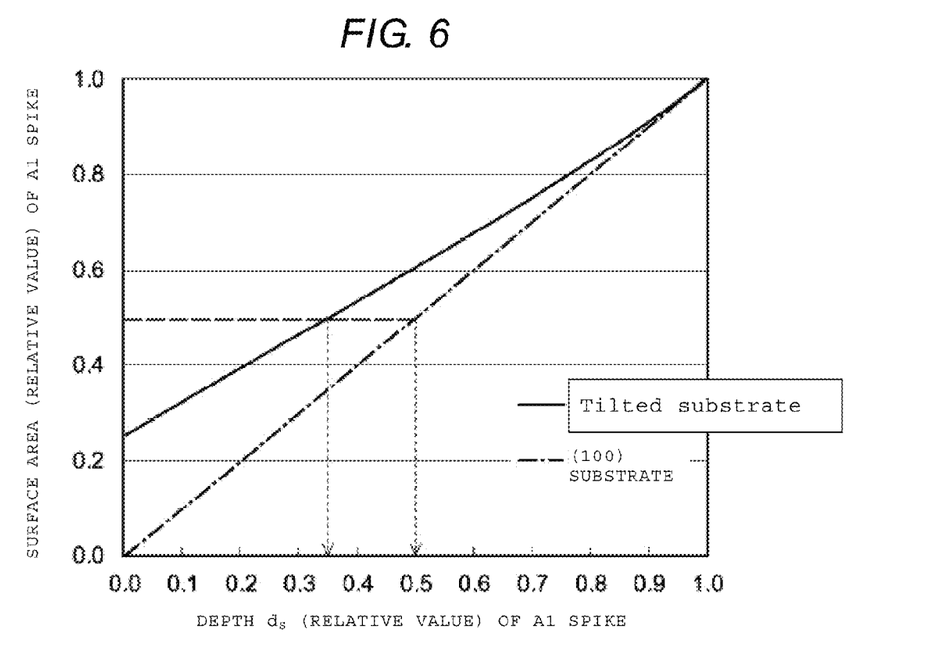
FIG. 6 is a graph showing the characteristics of the reactive region of the semiconductor device relating to the embodiments.
Figure 7A:
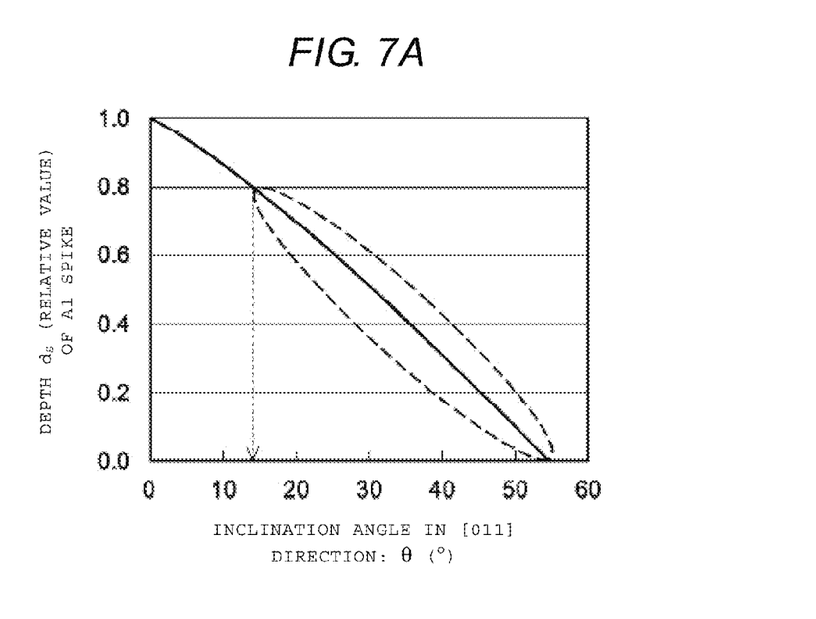
FIGS. 7A and 7B are other graphs showing the characteristics of the reactive region of the semiconductor device relating to the embodiments.
Figure 7B:
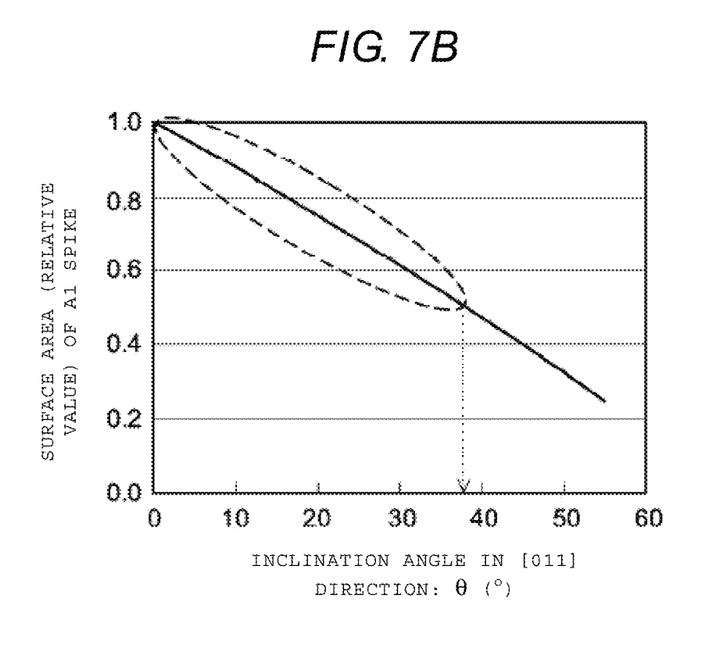

The FIGS. 6 and 7 show the characteristics of the reactive region of the semiconductor device 1 relating to this embodiment. FIG. 6 shows the relation of the surface area of the Al spike on the tilted substrate and the (100) substrate, and the relative depth of the Al spike $d_{s1}$. The y-axis shows the normalized surface area, and the x-axis shows the normalized depth $d_{s1}$.

A large increase in Vf can be prevented, for example, when the surface area of the Al spike is 50% or larger compared with the standard surface area of the Al spike with the inclination angle θ from the (100) plane of the upper surface 20a of the semiconductor layer 20 of 0° and with the 1 μm depth.

As shown in FIG. 6, the change in the surface area of the Al spike extending into the semiconductor layer 20 tilted from the (100) plane is smaller than that of the semiconductor with the (100) plane. For example, when the depth of the Al spike $d_{s1}$ from the standard point (1, 1) becomes shallow, the depth $d_s$, at which the surface area is reduced by 50%, is 50% for the (100) substrate and 34% for the tilted substrate. Therefore, the surface area of 50% can be maintained for a shallower $d_s$ for the tilted substrate compared with the (100) substrate.

FIG. 7A shows the relation between the depth of the Al spike $d_{s1}$ and the inclination angle θ toward the [011] direction when the length of the long side of the (111) plane of the triangular cross section shown in FIG. 5B is constant. As the inclination angle θ increases, the depth of the Al spike $d_{s1}$ decreases, and the depth of the Al spike $d_s$ becomes 0 (zero) at θ=54.7° which is the angle θ between the (100) plane and the (111) plane.

For example, in the semiconductor layer 20, as stated earlier, the breakdown voltage characteristics begin to deteriorate when the depth of the Al spike $d_{s1}$ exceeds 1 μm. Additionally, the breakdown voltage improves when the depth of the Al spike $d_{s1}$ is below 0.8 μm. When the depth of the Al spike $d_{s1}$ is deeper than 0.8 μm and shallower than 1 μm, the semiconductor devices with the low breakdown voltage appear scattered on the wafer surface, and the manufacturing yield decreases. Therefore, in order to improve the breakdown voltage characteristics when considering the process margin, it is effective to set the depth of the Al spike $d_{s1}$ to be 20% less of the depth at which the breakdown occurs. Therefore, as shown in FIG. 7A, the inclination angle θ toward the [110] direction is desirable at 14° or larger.

Next, FIG. 7B shows the relation between the surface area of the Al spike and the inclination angle θ toward the [110] direction when the length of the long side of the (111) plane of the triangular cross section shown in FIG. 5B is constant. As the inclination angle θ increases, the surface area of the Al spike decreases.

As stated earlier, to prevent Vf increase when the number of Al spikes remains unchanged, the surface area of the Al spike is desirable to be 50% or larger compared with the standard surface area of the Al spike with the inclination angle θ of 0°. According to the graph of FIG. 7B, by setting the inclination angle θ to less than 38°, the surface area of the Al spike can be 50% or larger.

There is a trade-off between the depth of the Al spike $d_{s1}$ and the inclination angle θ and the surface area. To avoid the deterioration of the breakdown voltage and the loss of the forward voltage, the inclination angle from the (100) plane toward the [110] direction is desirable to be between 14° and 38°. This way, the semiconductor device 1 that has both improved breakdown voltage and low loss characteristics can be achieved.

As stated earlier, regarding the semiconductor device 1 relating to this embodiment, by using the semiconductor layer 20 that has a tilted principal plane from the (100) plane, the deterioration of the breakdown voltage is suppressed by controlling the depth $d_{s1}$ of Al spike of the anode electrode 30 less than 1 μm, and the forward voltage Vf is decreased simultaneously by suppressing the reduction of the surface area of the Al spike. This way, having both the high breakdown voltage and low loss characteristics becomes possible. Furthermore, even when the carrier density of the semiconductor layer 20 is lowered, the contact resistance between the semiconductor layer 20 and the anode electrode 30 can be reduced. That is to say, by the use of the low carrier density semiconductor layer 20 the high speed characteristics can be achieved.

Although the semiconductor device 1 relating to this embodiment has been explained so far, the embodiment is not limited to FRD and may be other devices. Furthermore, the semiconductor layer 20 may be silicon carbide (SiC) layer. When the semiconductor layer 20 is a SiC layer, other metal films containing Al, or gold (Au) or metal films containing Au may be used for the anode electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor layer of a first conductive type;
   a second semiconductor layer having a cubic crystalline structure of a second conductive type formed on the first semiconductor layer and having an upper surface thereof tilted from the (100) plane thereof;
   an electrode formed on the upper surface; and
   a reactive region formed between the second semiconductor layer and the electrode, including at least one element constituting the second semiconductor layer and at least one element constituting the electrode forming a protuberance extending toward the second semiconductor layer.

2. The semiconductor device of claim 1, wherein
   the tilted angle of the upper surface from the (100) plane is between 14° and 38°.

3. The semiconductor device of claim 1, wherein
   the shape of the reactive region is a four-sided pyramid having a peak extending inwardly of the second semiconductor layer, and having the lateral sides which are parallel to the (111) planes of the second semiconductor layer.

4. The semiconductor device of claim 1, wherein, the electrode contains at least aluminum.

5. The semiconductor device according to the claim 4, wherein
   the tilted angle of the upper surface from the (100) plane is between 14° and 38°.

6. The semiconductor device according to the claim 1, wherein
   the upper surface is tilted from the (100) plane toward the [011] direction.

7. The semiconductor device according to the claim 6, wherein
   the tilted angle of the upper surface from the (100) plane is between 14° and 38°.

8. The semiconductor device according to the claim 6, wherein the electrode contains at least aluminum.

9. The semiconductor device of claim 8, wherein the reactive region is an alloy of aluminum and the semiconductor of the second semiconductor layer; and the contact resistance between the alloy and the second semiconductor layer is lower than the contact resistance between the second semiconductor layer and the aluminum containing electrode.

10. The semiconductor device of claim 8, wherein the upper surface of the second semiconductor layer is tilted from the (100) plane toward the [011] direction with an angle of from 14° to 38°.

11. The semiconductor device of claim 10, wherein the shape of the reactive region is a four-sided pyramid having a peak extending inwardly of the second semiconductor layer, and having the lateral sides which are parallel to the (111) planes of the second semiconductor layer.

* * * * *